US008288945B2

(12) United States Patent
Naaman et al.

(10) Patent No.: US 8,288,945 B2
(45) Date of Patent: Oct. 16, 2012

(54) METHOD FOR FABRICATING NANO-SCALE PATTERNED SURFACES

(75) Inventors: Ron Naaman, Yarkona (IL); Ben Golan, Kiryat Ono (IL); Zeev Fradkin, Kiryat Malachi (IL); Adam Winkleman, Brookline, MA (US); Dan Oron, Rehovot (IL)

(73) Assignee: Yeda Research and Development Company Ltd, Rehovot (IL)

( * ) Notice: Subject to any disclaimer, the term of this patent is extended or adjusted under 35 U.S.C. 154(b) by 0 days.

(21) Appl. No.: 12/880,107

(22) Filed: Sep. 12, 2010

(65) Prior Publication Data

US 2011/0006674 A1  Jan. 13, 2011

Related U.S. Application Data

(63) Continuation of application No. PCT/IL2009/000269, filed on Mar. 10, 2009.

(60) Provisional application No. 61/035,162, filed on Mar. 10, 2008.

(51) Int. Cl.
  H01J 40/06  (2006.01)
  H01J 9/12  (2006.01)
(52) U.S. Cl. .......... 313/542; 445/49; 313/495; 313/498; 977/949
(58) Field of Classification Search .................. 313/542
  See application file for complete search history.

(56) References Cited

U.S. PATENT DOCUMENTS

| 3,867,662 A | 2/1975 | Endriz |
| 3,894,332 A | 7/1975 | Nathanson et al. |
| 3,988,497 A | 10/1976 | Asakura |
| 6,126,845 A | 10/2000 | Cathey et al. |
| 6,350,397 B1 | 2/2002 | Heikkila et al. |
| 2003/0178583 A1 | 9/2003 | Kampherbeek et al. |
| 2006/0276043 A1 | 12/2006 | Johnson et al. |
| 2007/0224391 A1 | 9/2007 | Krupenkin et al. |

FOREIGN PATENT DOCUMENTS

| EP | 1003196 A1 | 5/2000 |
| EP | 1319948 A2 | 6/2003 |
| EP | 1413923 A2 | 4/2004 |
| WO | 0223576 A1 | 3/2002 |

OTHER PUBLICATIONS

International Search Report, mailed Jun. 21, 2009 from PCT/IL2009/000269, filed Mar. 10, 2009.
International Preliminary Report of Patentability, mailed Sep. 14, 2010 from PCT/IL2009/000269, filed Mar. 10, 2009.

(Continued)

Primary Examiner — Tracie Y Green
(74) Attorney, Agent, or Firm — Patentbar International P.C.

(57) ABSTRACT

A method for fabrication of substrate having a nano-scale surface roughness is presented. The method comprises: patterning a surface of a substrate to create an array of spaced-apart regions of a light sensitive material; applying a controllable etching to the patterned surface, said controllable etching being of a predetermined duration selected so as to form a pattern with nano-scale features; and removing the light sensitive material, thereby creating a structure with the nano-scale surface roughness. Silanizing such nano-scale roughness surface with hydrophobic molecules results in the creation of super-hydrophobic properties characterized by both a large contact angle and a large tilting angle. Also, deposition of a photo-active material on the nano-scale roughness surface results in a photocathode with enhanced photoemission yield. This method also provides for fabrication of a photocathode insensitive to polarization of incident light.

7 Claims, 13 Drawing Sheets

OTHER PUBLICATIONS

Alves, M. A. R. et al. "Fabrication of Sharp Silicon Tips Employing Anisotropic Wet Etching and Reactive Ion Etching", Microelectronics Journal, 2005 No. 36, pp. 51-54.

Ma, M. et al. "Superhydrophobic Surfaces", Current Opinion in Colloid & Interface Science 2006, No. 11, pp. 193-202.

Li, X. M. et al. "What Do We Need for a Superhydrophobic Surface? A Review on the Recent Progress in the Preparation of Superhydrophobic Surfaces", Chem. Soc. Rev., 2007, 36, 1350-1368.

Prevo, B. G. et al. "Assembly and Characterization of Colloid-Based Antireflective Coatings on Multicrystalline Silicon Solar Cells" J. Mater. Chem., 2007, 17, 791-799.

Fuerstner et al "Wetting and Self-Cleaning Properties of Artificial Superhydrophobic Surfaces", Langmuir 2005, 21, 956-961.

Hong, X. et al. "Application of Superhydrophobic Surface with High Adhesive Force in No Lost Transport of Superparamagnetic Microdroplet", J. Am. Chem. Soc. 2007, 129, 1478-1479.

Guo, Z-G. et al., "Sticky Superhydrophobic Surface", Applied Physics Letters 90, 223111 (2007).

Song, X. Y. et al. "Fabrication of Superhydrophobic Surfaces by Self-Assembly and Their Water-Adhesion Properties", J. Phys. Chem. B 2005, 109, 4048-4052.

Li, W. et al. "Superhydrophobic Surfaces: Adhesive Strongly to Water?", Adv. Mater. 2007, 19, 3421-3422.

Wang, S. et al. "Definition of Superhydrophobic States", Adv. Mater. 2007, 19, 3423-3424.

Ou, J et al "Laminar Drag Reduction in Microchannels Using Ultrahydrophobic Surfaces", Physics of Fluids. 16(2), 2004. 4635-4643.

Martines, E. et al., "Superhydrophobicity and Superhydrophilicity of Regular Nanopatterns", Nano Letters. 5(10), 2005. 2097-2103.

Kim, et al., "Wetting Behaviours of a-C:H:Si:O Film Coated Nano-Scale Dual Rough Surface", Chemical Physics Letters. 436(1-3), 2007. 199-203.

Blossey, R., "Self-Cleaning Surfaces-Virtual Realities", Nature Minerals, 2(5), 2003. 301-306.

Thomas, R. N. et al., "Photosensitive Field Emissions from Silicon Point Arrays", Applied Physics Letters. 21(8), 1972. 384-386.

METHOD FOR FABRICATING NANO-SCALE PATTERNED SURFACES

CROSS-REFERENCE TO RELATED APPLICATIONS

This application is a continuation application of International Application PCT/IL2009/000269 filed on Mar. 10, 2009, which in turn claims priority to U.S. Provisional Application 61/035,162 filed on Mar. 10, 2008, both of which are incorporated herein in their entirety.

FIELD OF THE INVENTION

The present invention relates to a method for patterning surfaces, particularly useful for creating a surface pattern with nano-scale features.

BACKGROUND OF THE INVENTION

Maintaining the position of a nearly spherical drop of water on a hydrophobic substrate appears to be a contradiction. Typically, water droplets easily move across such hydrophobic surfaces and cannot be attached to a well-defined position.

The ability to retain a well-defined drop on a substrate may have great technological significance, including the ability to spectroscopically probe a single drop over extended periods of time and to hold a living cell for spectrocopical probing. This technique could serve as an important tool in single-molecule-spectroscopy, which is often limited by the short residence time of each molecule within the illuminated volume. It is known to immobilize molecules on a substrate in order to probe minute biological material. This is done either by directly linking the probed molecule to the substrate [1, 2, 3, 4, 5, 6] or by immobilizing the molecules by inserting them into surface-tethered lipid vesicles [7]. However, these various methods may affect the structure and/or the reactivity of the molecules.

The basic technology for fabricating arrays of silicon nanotips is known and has found numerous applications, such as field emitter arrays in vacuum microelectronic devices (e.g., flat panel displays [8]), and recently as tips for AFM microscopy [9,10]. The standard method for fabricating nanotips in silicon combines photolithography and reactive ion etching (RIE) using a silicon oxide, a silicon nitride mask, or a hydrogenated-carbon mask [8,9,11].

Many of the methods for designing new materials having large contact angles (greater than 150°) combine a set of common physical and chemical characteristics: (i) patterning roughness on two very different length scales (both μm- and nm-scales), and (ii) using chemical methods to present hydrophobic moieties at the surface[12, 13]. These super-hydrophobic surfaces (i.e. hydrophobic surface having a nano-scale roughness) have shown potential for applications in water-repelling substrates and self-cleaning surfaces (specifically silicon-based solar cells) [12, 14, 15].

It should be noted that super-hydrophobic surfaces are commonly associated with large contact angles with water drop, but also small tilting angles (i.e. roll-off), e.g. less than 5°. Notable exceptions to this observation include pinned water droplets on a film of aligned polystyrene nanotubes, [13, 16] an etched aluminum alloy composed of micro-orifices and nano-particles, [17] and a monolayer of an organo- or fluorosilane self-assembled onto a laser-ablated silicon wafer [18]. In these systems, the water droplet could be suspended upside down without rolling or falling from the surface. These works have led to a debate in the literature as to the definition of super-hydrophobicity and possible microscopic mechanism for this macroscopic observation [19, 21]. The suggested mechanism underlying this pinning effect is that the droplet wets the substrate and/his wetting creates a large contact area between the droplet and the surface. Because of the high surface roughness of the substrate, the sum total of the van der Waals forces between the droplet and the substrate integrated over this large contact area is sufficient to pin the drop onto the surface. Another hypothesis is that a placed drop on the surface creates pockets of air isolated from the atmosphere and this trapped air increases the adhesion because of a negative pressure induced by the increase in volume of an air pocket as the drop is pulled away from the surface [17, 20]. These mechanisms are similar to the one proposed to explain the capabilities of a gecko's feet [21].

GENERAL DESCRIPTION

There is a need in the art to fabricate a structure having a surface roughness with nano-scale features. The present invention provides a novel technique for fabricating such structures by using a photolithography process with controllable etching of a selected duration resulting in nano-scale surface roughness of the surface after removal of a photosensitive material. More specifically, a pattern of a light sensitive material (photoresist) is created on a surface of a substrate, controllable etching is applied to the photoresist patterned surface so as to create a pattern in the form of spaced-apart "pitted" regions (surface relief) with nano-scale features (either pits or tip-like projections between them). Preferably, dry-etching is used thereby facilitating controlling of the etching time to ensure the nano-scale features of the pattern.

The invention provides for using this type of patterned surfaces for holding hydrophilic micro-scale objects in a fixed position; as well as a basis for high efficient photocathode, which is insensitive to the light polarization.

Thus, according to one broad aspect of the invention, there is provided a method for use in fabrication of a substrate having a nano-scale surface roughness, the method comprising:

patterning a surface of a substrate to create an array of spaced-apart regions of a light sensitive material;

applying a controllable etching to the patterned surface, the controllable etching being of a predetermined duration selected so as to form a pattern with nano-scale features; and removing the light sensitive material thereby creating a structure with the nano-scale surface roughness.

Thus, by appropriately selecting the etching time, a nano-scale roughness of the surface can be provided.

In some embodiments, the method comprises silanizing the surface of the structure by a hydrophobic self-assembled monolayer, thereby creating super-hydrophobic properties within the nano-scale size features characterized by both a large contact angle and a large tilting angle with respect to a hydrophilic object placed on it. The large contact angle may be up to 150° or higher, the large tilting angle may be up to 90° or higher.

In some embodiments, the controllable etching is dry etching.

The etching of the photoresist patterned surface may be performed by a reactive ion etching procedure, using the array of spaced-apart regions of a light sensitive material (e.g. photoresist pattern) as an etching mask. The reactive ion etching procedure may be an inductively coupled plasma reactive ion etching (ICP-RIE) procedure. Removal of the photoresist may be performed by sonication in organic solvents.

The substrate may have a large surface area of up to several cm².

The substrate may be a semiconductor, such as silicon.

In some embodiments of the invention, the resulted nano-scale patterned substrate is used for fabrication of super-hydrophobic properties. To this end, the patterned surface is silanized by a self-assembled monolayer of hydrophobic molecules. As a result, the nano-scale regions (resulted from the controllable etching) receive super-hydrophobic properties. It should be noted that the term super-hydrophobic in the meaning of the technique of the present invention signifies a surface property characterized by both very large contact angle and tilting angle. It should be understood that this is contrary to the common meaning of the term super-hydrophobic according to which a surface property of a large contact angle but small tilting angle is considered. The present super-hydrophobic region can hold hydrophilic micro-scale objects (e.g. water drops, living cells) at a fixed position. Therefore, the spaced-apart regions of the structure are characterized by large contact and tilting angles with respect to a hydrophilic object placed on it.

The hydrophobic self-assembled monolayer may be selected from octadecyltrichlorosilane (OTS) and (1H, 1H, 2H, 2H-perfluorooctyl) silane (PF).

According to another broad aspect of the present invention, there is thus provided a method for creating a surface pattern of spaced-apart regions having super-hydrophobic properties, namely regions having both very large contact (e.g. up to about 150° and higher) and large tilting angles (e.g. up to 90° and higher).

The so-patterned substrate can thus effectively pin a nearly spherical drop in-place despite its large contact angle. The present technique allows pinning of a water drop for very long times without affecting the properties of molecules dissolved in the water. It can also be used to hold living cells without affecting their shape or other properties.

The method of the present invention may also be used for fabrication of an array of spaced-apart (i.e. isolated) nano tips located within at least some of the nano-scale features of the pattern.

The nano-tips may have length-scales features extending over about two orders of magnitude e.g. a diameter in the range of about 10 to 50 nm and a height in the range of about 0.5-2 microns.

The method may also be used for the fabrication of an array of spaced-apart posts located on at least some of the nano-scale features of the pattern.

According to this technique, large arrays of nano-tips may be fabricated with a one-step simple etching process, together with silanization, to achieve a substrate with both very large contact and tilting angles. The main advantages of this process include inter alia the following: i) the method uses standard chemical processes (photolithography, Reactive Ion Etching (RIE), and silanization) and can use standard materials (silicon wafers); ii) it can be applied to surfaces of relatively large areas (>1 cm²); and iii) it yields super-hydrophobic surfaces that allow for ease of handling of substrates after applying a water drop without loss of the drop. The arrays of nano-tips in silicon may be fabricated by reactive ion etching using polymer masks defined by photolithography. A droplet sitting on one place of these substrates does not fall even after the substrate is turned upside down.

The arrays of nano-tips in silicon may be fabricated using both positive and negative photoresist as the mask for creating surfaces by inductively coupled plasma reactive ion etching (ICP-RIE), with features ranging in size from nanometers to microns. These tips are fabricated with features over two orders of magnitude, where the smallest features, defined by the diameter of the tip, are as small as 15 nm. Upon silanization of these surfaces by hydrophobic monolayers (e.g., octadecyltrichlorosilane (OTS) or (1H, 1H, 2H, 2H-perfluorooctyl) silane (PF)), the substrates fabricated from the positive photoresist yield contact angles higher than 140°, e.g. 162°. The tilting angle is defined as the angle at which the drop falls from the surface. When a water droplet is positioned on the surface of a substrate and the substrate is tilted slowly, the droplet did not roll or slide even for angles up to 90°. For those substrates, the drop can also be flipped 180° and suspended upside down.

According to yet another broad aspect of the invention, there is provided a structure having a hydrophobic surface having a pattern (an array) of spaced-apart regions having super-hydrophobic properties characterized by large contact and tilting angles. The spaced-apart regions may comprise nano tips and/or posts.

According to some other embodiments of the present invention, the method of the present invention may be used for fabricating a photoemitting substrate insensitive to light polarization. Specifically, the present invention provides a photoemitting substrate or a substrate carrying a photoemitting layer on top thereof (i.e. surface emitting electrons after absorption of energetic photons) configured such that the photoemission from it does not depend on the polarization of incident light. The substrate may thus be used to fabricate a photocathode insensitive to light polarization. The photoemission of the nano-scale features of the pattern is thus independent of polarization of incident light. The method thereby comprises creating photocathode regions insensitive to light polarization.

As indicated above, the controllable etching results in the surface relief (pitted regions spaced apart by tip-like regions) with nano-scale features of the patterns. Due to the tips, the photoemission yield also increases by the interaction of plasmons on the surface with the light.

Generally, electrons are photoemitted more efficiently by light polarized perpendicular to the surface (p-polarization) than when light is polarized parallel to the surface (s-polarization). In the limit of the Jellium model, it is expected that only light polarized perpendicular to the substrate will induce photoemission.

There is therefore a need to provide a photocathode, fabricated on a structure as defined above (having a nano-scale pattern resulting from a controllable etching), wherein photoemission of the nano-scale features of the pattern (e.g. spaced-apart regions) does not depend on polarization of incident light (i.e. the photocathode being insensitive to light polarization). More specifically, the ratio between the intensities of emission due to p-polarized light to that due to s-polarized light is about 1.

There is also provided a method for fabrication of a nano-scale roughness (i.e. surface relief) surface, enabling to change the physical properties of a substrate by obtaining efficient photoemission using either p- or s-polarization.

The patterned substrate is usually either silicon or glass, however it can be coated by any metal or semiconductor film and thereby, while the emission yield and energy depend on the type of the film, the insensitivity to polarization remains due to the substrate patterning.

There is also provided a method for fabricating photocathode elements, the method comprising applying the method as described above to produce the structure having nano-scale surface roughness; and depositing a photo-active material on the surface thereby enhancing its photoemission yield.

BRIEF DESCRIPTION OF THE FIGURES

In order to understand the invention and to see how it may be implemented in practice, some embodiments will now be described, by way of non-limiting example only, with reference to the accompanying drawing, in which FIG. 1 schematically illustrates an example of a method of the invention for fabrication of a structure having a nano-scale surface roughness;

FIGS. 2A-2C represent substrates etched through the positive photoresist mask; FIGS. 2D-2F represent substrates etched through the negative photoresist mask;

FIG. 3A illustrates an insufficient etching time yielded under-etched structures with a flat top and an hour-glass shape; FIG. 3B illustrates an over-etched substrate yielded a topographically diverse substrate; FIG. 3C illustrates a higher magnification image (from a different substrate than FIG. 3B);

FIG. 4A illustrates a large-area image showing that the surface is a patch-work of different etching depths; FIG. 4B is an image of two pitted regions containing four defect sites; FIG. 4C is a higher magnification of the pitted region from the upper left corner in FIG. 4B;

DETAILED DESCRIPTION OF EXEMPLARY EMBODIMENTS

Figure 1:
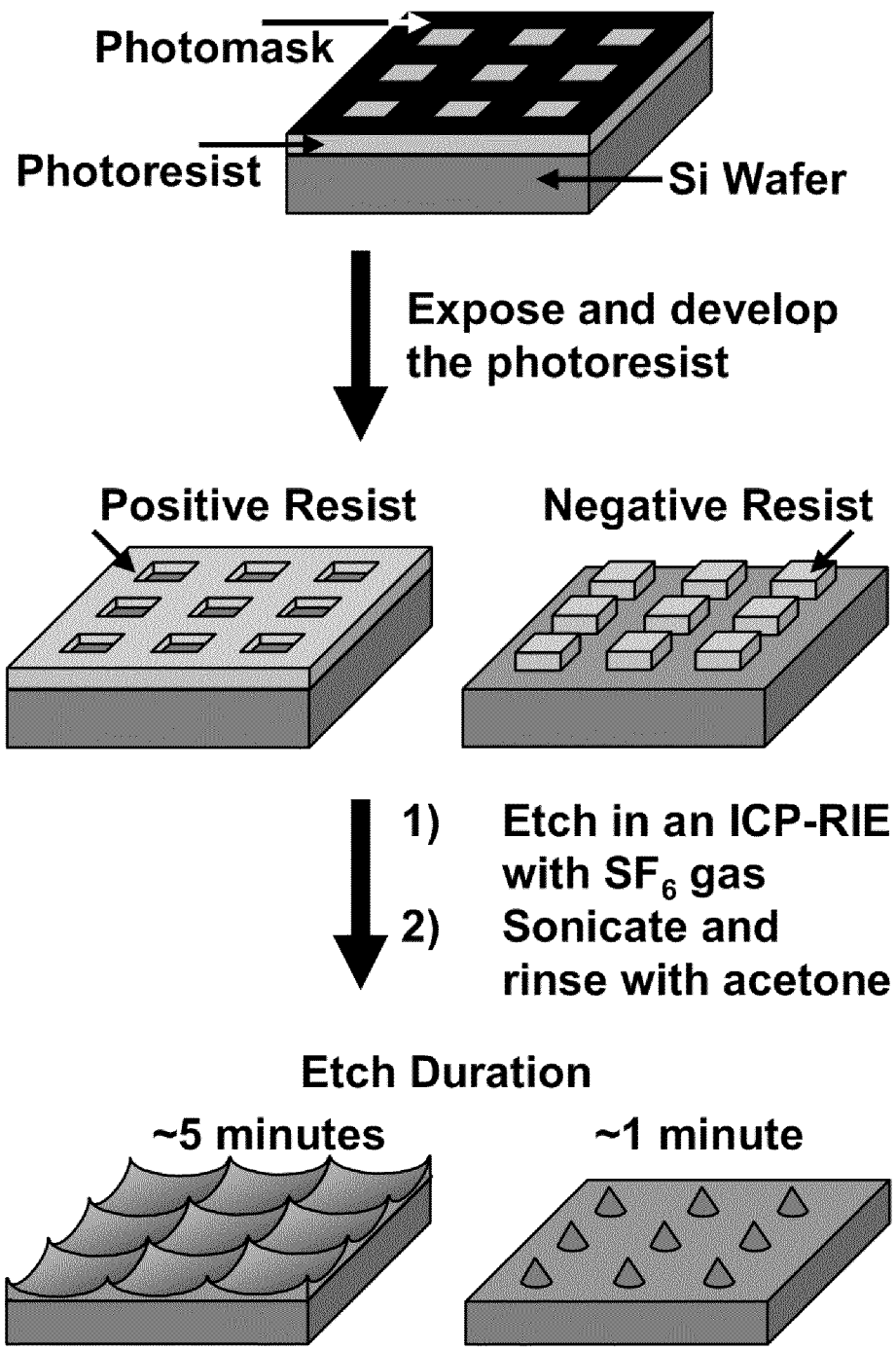

Reference is made to FIG. 1 outlining the procedure used to fabricate a structure having a surface roughness with nano-scale features in accordance with the technique of the present invention. The invention utilizes a photolithography process with controllable etching having selected duration. The duration of the etching is selected such as to provide nano-scale size of the etched regions.

In this specific but non-limiting example, a 1-2 µm-thick film is spun-cast of either a positive or negative photoresist (constituting a light sensitive material) onto a flat silicon wafer. For clarity and brevity, substrates that used a positive photoresist are defined as "positive substrates" and substrates that used a negative resist as "negative substrates". In the present example, the photomask (e.g. chromium mask) includes a grid of crossed lines 2.5 µm lines, spaced by 2.5 µm along both axes. Both the positive and negative substrates are exposed through the mask, and the resists are developed to yield either an array of square wells or square posts, respectively.

It should be noted that the patterned photoresist layer is preferably used directly as the mask for the RIE procedure and not a silicon oxide or nitride layer, as conventionally used. Using the photoresist pattern as the etching mask simplifies the processing of the silicon substrate by eliminating at least one step. The main requirement for the photoresists is that they should not degrade during the RIE process.

Thus, after exposure and development of the photoresist, the substrates are placed in an ICP-RIE and etched by SF6 gas, (e.g. SF6 gas/plasma (10 mT, 80 sccm, 2 kW applied to the coil) using the photoresist as the etching mask. The substrates with the positive resist mask are etched for about 5 minutes and the negative resist was etched for about one minute. Upon completion of the etching process, the substrates are sonicated and washed with acetone and isopropanol to remove the photoresist.

The resulted patterned surface the substrates, can then be silanized by a self-assembled monolayer of hydrophobic molecules. This will result in the creation of super-hydrophobic properties (characterized by both the large contact angle and the large tilting angle) within the nanoscale size surface region (resulting from the controllable etching).

Reference is made to FIGS. 2A-2F representing SEM images of a nano-tip arrays fabricated using the teachings of the present invention.

Figure 2C:
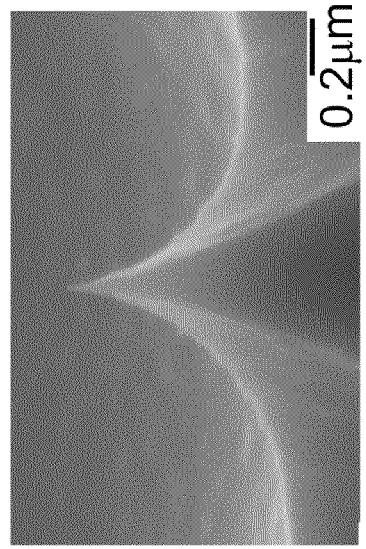
FIGS. 2A-2F show a set of SEM images of the nano-tips surfaces illustrating length-scales that span two orders of magnitude for both the substrates etched through the positive and negative photoresist masks; in particular.
Figure 2F:
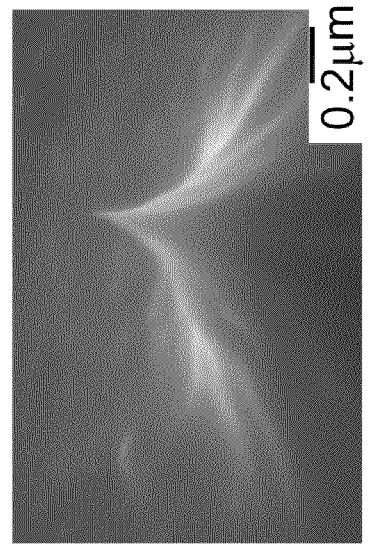
Figure 2B:
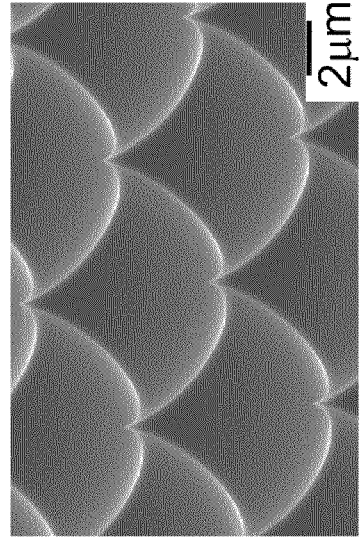
Figure 2E:
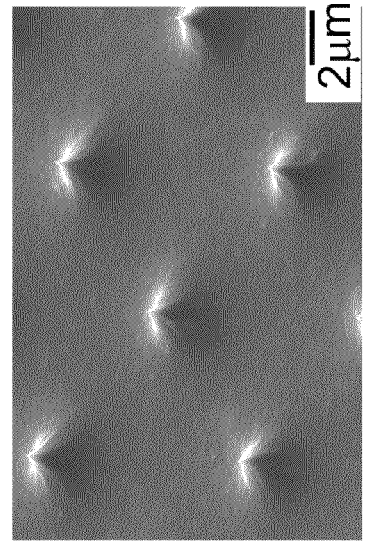
Figure 2A:
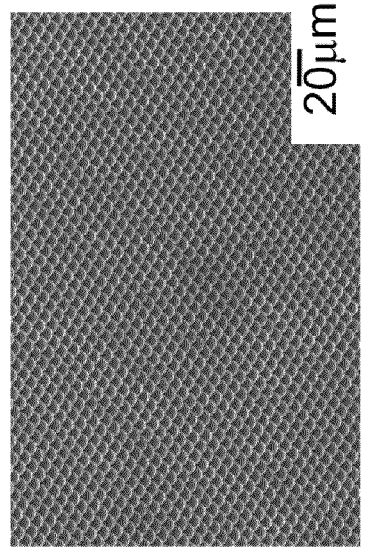

FIGS. 2A-2C illustrate substrates etched through the positive photoresist mask. The positive substrates yield a silicon surface with lots of curvature and nano-tip structures located under the vertices of the grid-patterned photoresist with additional raised features spanning the tips. The nano-tips formed are typically 15-50 nm in diameter and the height from the tip to the nadir of the well is about 1-2 microns.

Figure 2D:
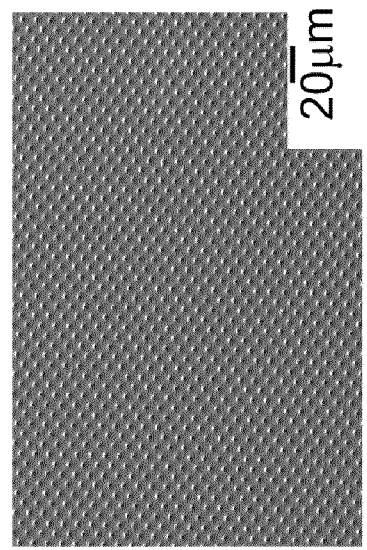

FIGS. 2D-2F illustrate substrates etched through the negative photoresist mask. The negative substrates yield isolated nano-tips on a relatively smooth silicon surface. The range of tip diameters on the negative substrates is similar to that of the positive structures, but the height is shorter (less than one micron) than that of the positive structures. The magnification in each image is the same for both sets of substrates.

As shown in FIGS. 2A and 2D, in both substrates, the tips are fabricated with long-range order and uniform feature sizes. In FIGS. 2B and 2E, the nano-tips have the same periodicity and density. It should be noted that the exact position of the nano-tips relative to the photomask is opposite for the two samples. FIG. 2B illustrates a nano-tip formed by the intersection of the crossed lines of the polymer mask. A raised edge connects each tip to one of its four neighboring tips and results in a nadir region in the center; these raised edges yielded a nano-tip with four facets. The final structure of a substrate with a positive mask is an "egg-carton" structure. FIG. 2E shows that the etched surface between the tips is relatively smooth and flat, and that the tips do not have a distinct number of facets. FIGS. 2C and 2F illustrate an image of a single nano-tip with a diameter of about 15 nm for both substrates. Both structures yield highly ordered arrays over large areas exceeding one $cm^2$. The major defect in both types of nano-tips is due to non-uniform RIE. These defects were typically pitting in the regions between the nano-tips. These features were much more common with the structures made from the positive photoresist.

Fabrication of regular nano-tips, especially for those samples using a positive photoresist mask, is very sensitive to the etching times in the ICP-RIE. For example, differences of 1-2% in the etching time (i.e., about 5 second change for a total time of about 5 minutes for an etch) are often the difference between obtaining a desired sample or one that is either an under-etched sample or is over-etched. If the time is too short, the etching would be insufficient, resulting in an hour-glass-like structure with a relatively large flat top region that was the original silicon wafer surface.

Figure 3A:
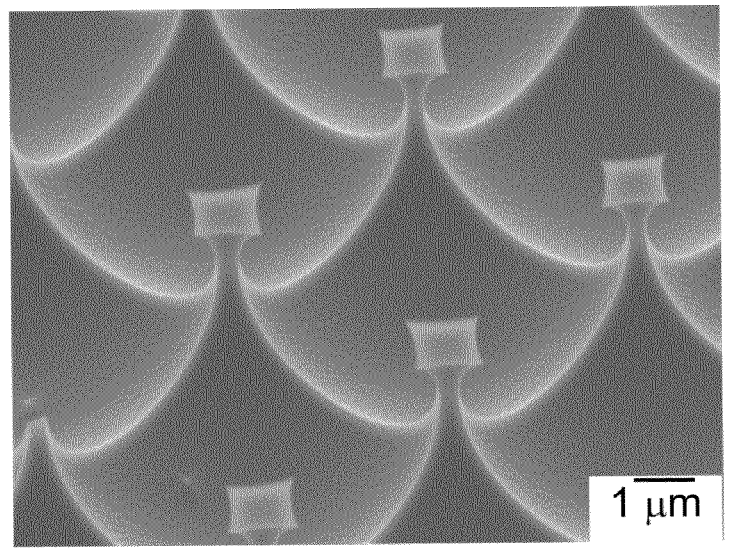
FIGS. 3A-3C show a set of SEM images under non-optimal conditions for the ICP-RIE for a positive substrate; in particular.
Figure 3B:
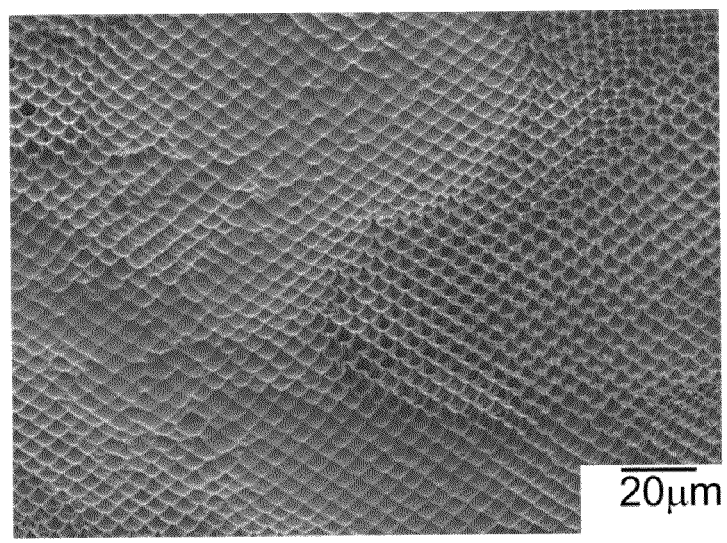
Figure 3C:
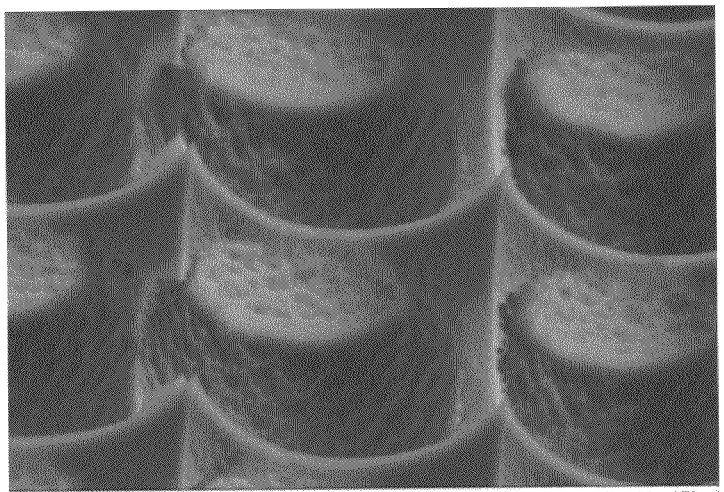
Figure 4A:
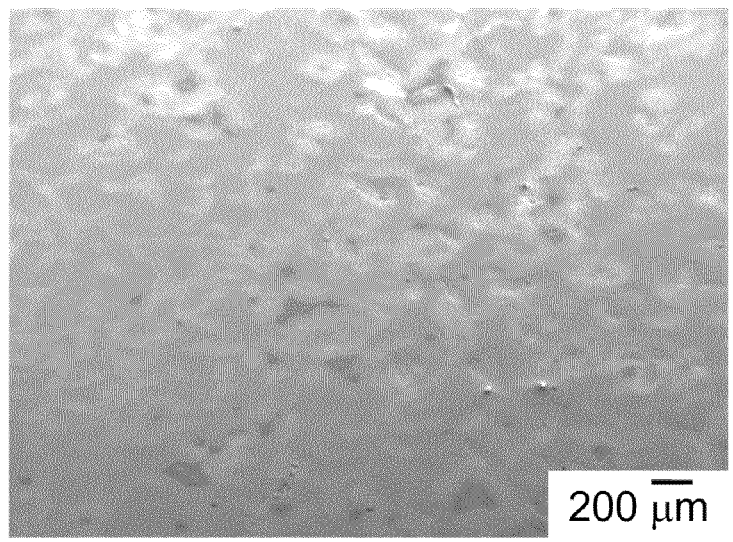
FIGS. 4A-4C are a set of SEM images of a substrate from a positive photoresist mask illustrating the non-uniform etching on the mm-scale; in particular.
Figure 4B:
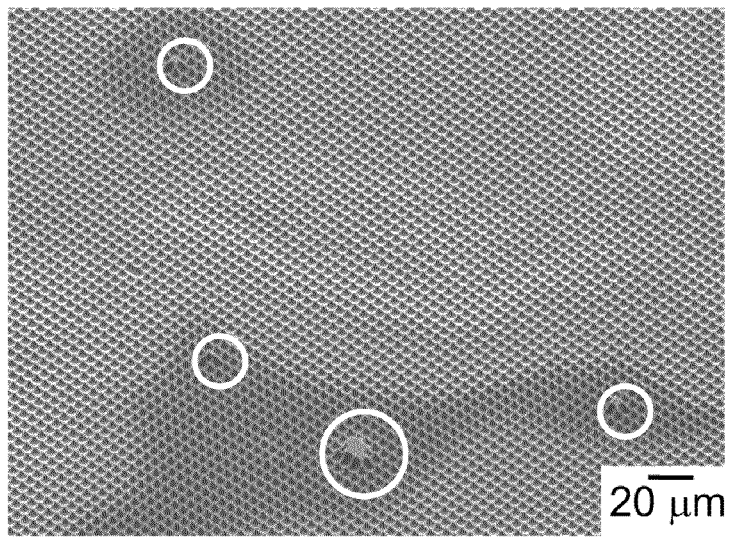
Figure 4C:
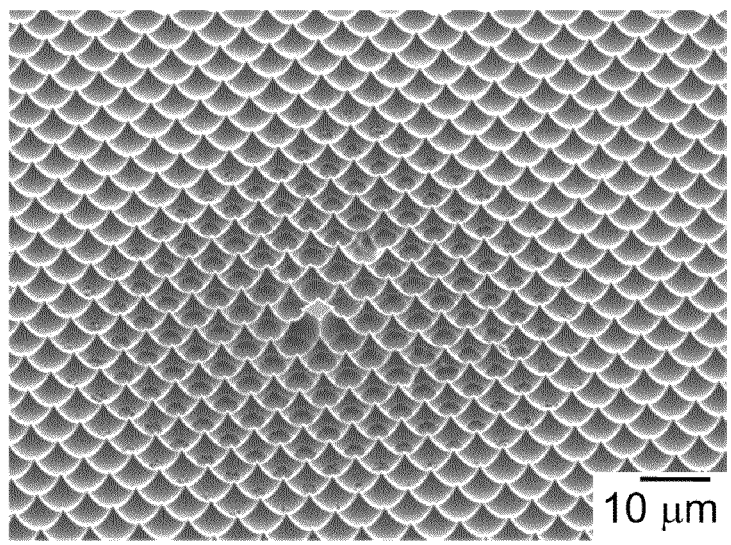

In this connection, reference is made to FIG. 3A illustrating an insufficient etching time yielded under-etched structures with a flat top and an hour-glass shape. The nano-tips do not form at the original silicon surface but the etching creates a neck that breaks about one micron below the resist. For over-etched substrates, the plasma typically has etched away the nano-tips and has created shorter structures with non-regular angles and tunneling between adjacent nadir regions. FIGS. 3B-3C illustrate an over-etched substrate yielding a topographically diverse substrate. Excessive pitting, complete removal of the nano-tips and structures that are not normal to the original substrate are common features observed. FIG. 3C is a higher magnification image (from a different substrate than in FIG. 3B) illustrating etched tunnels between the neighboring nadir regions between a pair of nano-tips; regions containing these tunnels are often observed in over-etched substrates. Even for well-etched samples, some regions of pitting are observed. These regions are typically tens to hundreds of microns in diameter and appeared optically as dark regions on the substrate. These "dark" features are due to non-uniform exposure to the plasma during the etching process and are correlated with defects in the lithography, as illustrated in FIGS. 4A-4C.

The non-uniformity of the lithography may result from defects in the photoresist mask, which affected the local electric field and the plasma flow patterns in the ICP-RIE. FIGS. 4A-4C illustrate a non-uniform etching at the mm-scale. Differences in color correspond to differences in etching depth, and the presence of pitting. Dark regions are deeper than light regions and the darkest regions are pitted. FIG. 4A is a large-area image showing that the surface is a patch-work of different etching depths. The pitted regions are randomly interdispersed and average size of a region is tens to hundreds of microns across. FIG. 4B is an image of two pitted regions containing four defect sites. These sites are unetched, raised plateaus in the silicon due to defects in the mask. The pitted regions (the darkest regions) always have a defect in the center. FIG. 4C is a higher magnification of the pitted region from the upper left corner in FIG. 4B. At the center, a single square that was not developed in the photomask is observed. The pitted regions are the dark circles that reside in the nadir region between four tips. The extent and degree of pitting decrease radially from the defect site. It should be noted that, as related above, conventionally, the common feature of systems in which pinning of water drops is observed together with high contact angle, is the presence of regions with pores that could possibly trap air that is isolated from the atmosphere. The technique of the present invention enables a high degree of pitting crucial to the adhesion. In the experiments using the technique of the present invention, this pitting is not observed in overetched substrates, (where the pitting would be interconnected to the atmosphere) and in under-etched substrates (where no pits are present).

Figure 5A:
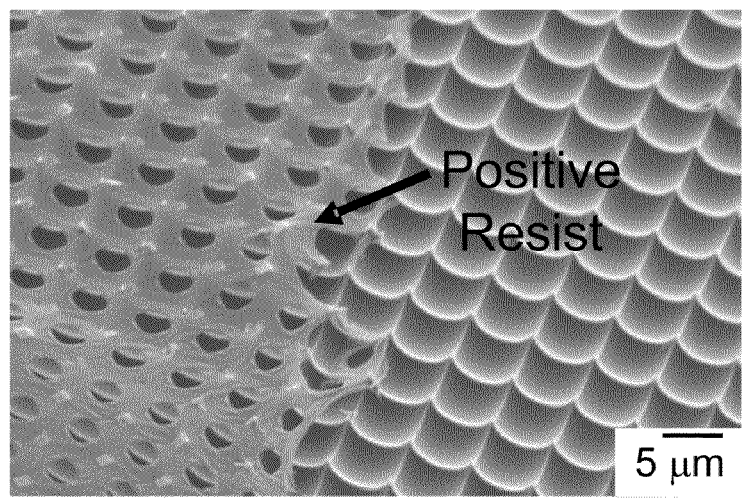
FIGS. 5A-5B show a set of SEM images after RIE and a rinsing step but without sonication in organic solvents; these images illustrate that both the positive (FIG. 5A) and negative (FIG. 5B) photoresist masks remains intact after the RIE process.
Figure 5B:
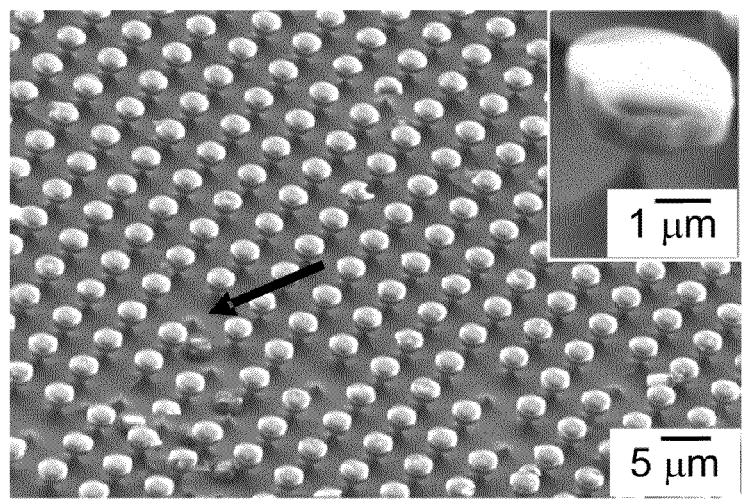

Reference is made to FIGS. 5A-5B representing a set of SEM images of positive (5A) and negative (5B) photoresist masks that remain intact after the RIE process. In FIG. 5A, the cross line pattern of the positive resist mask can clearly be observed; the resist maintains its integrity. In FIG. 5B, the negative resist remains as a cap on top of the tip. In some cases, the resist fell from the tip during the processing (white arrow). The inset is a magnified image of a single tip with the negative resist still on-top. The resists charge during scanning and cause small distortion in the image.

Wet-etching processes, although more isotropic, could not produce the expected results. The positive resists are soluble in organic solutions and basic aqueous solutions, typical solvents for etching silicon wafers. The negative resist is insoluble in most solvents; however, it has poor adhesion to silicon. Lift-off of the resist from the silicon is common especially if there is any agitation (i.e., sonication or stirring) during the etching.

Figure 6A:
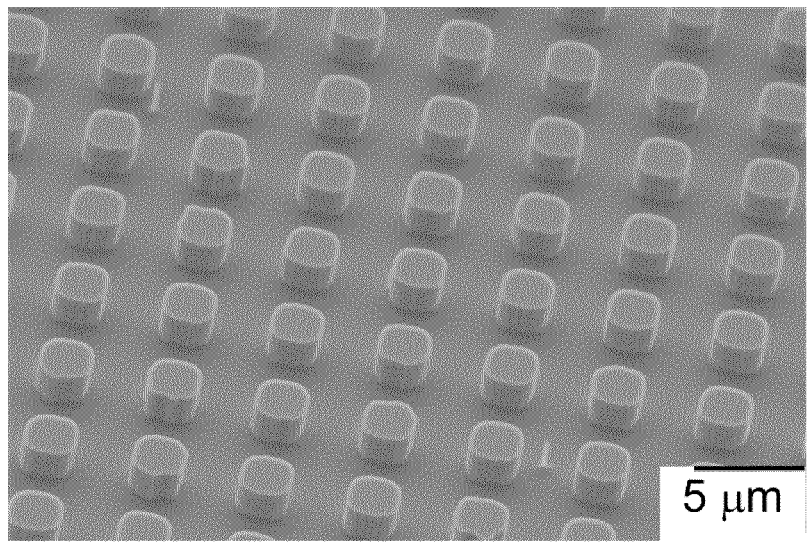
FIGS. 6A-6B are a set of SEM images of posts etched in silicon using the negative resist and same photomask.
Figure 6B:
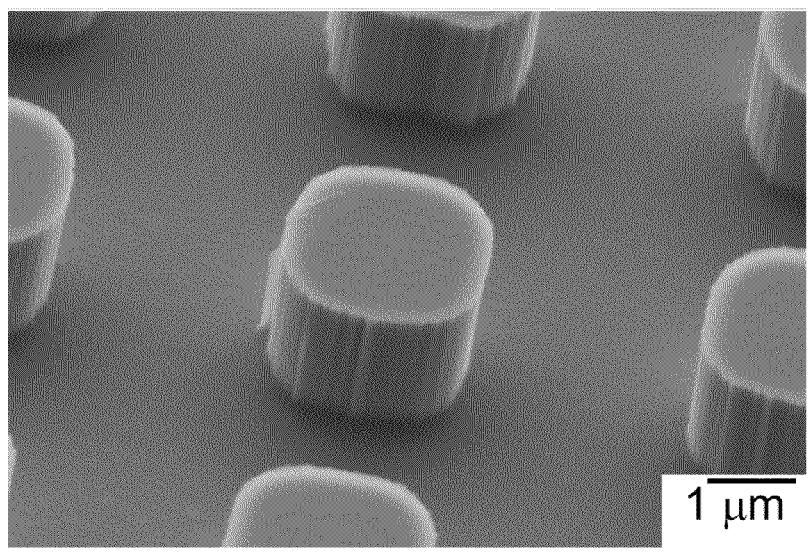

According to the technique of the present invention, posts in silicon may also be fabricated using the same masks used for making the nano-tip structures. In this connection, reference is made to FIGS. 6A-6B representing substrates containing posts. These substrates having posts have different properties than the substrates with nano-tips. These differences are related to the hydrophobic character of the substrates as follows: i) the surface roughness of the posts is more uniform across the entire sample (about 1 $cm^2$). The use of the Bosch process (i.e. deep Si etching at room temperature) creates vertical side walls and prevents pitting of the etched silicon. ii) The silicon surface of the posts is also locally less rough than the local roughness of the nano-tip substrates. The top surface, which was protected from the plasma etch, is the original polished silicon. Since these substrates possess surface roughness over multiple length scale, (a property characterizing super-hydrophobic materials), both the contact and tilting angles of these substrates with water is measured. All patterned silicon substrates with a native oxide surface are found to be hydrophilic. Silanization of the substrates by either OTS or PF yield hydrophobic surfaces.

Figure 7A:
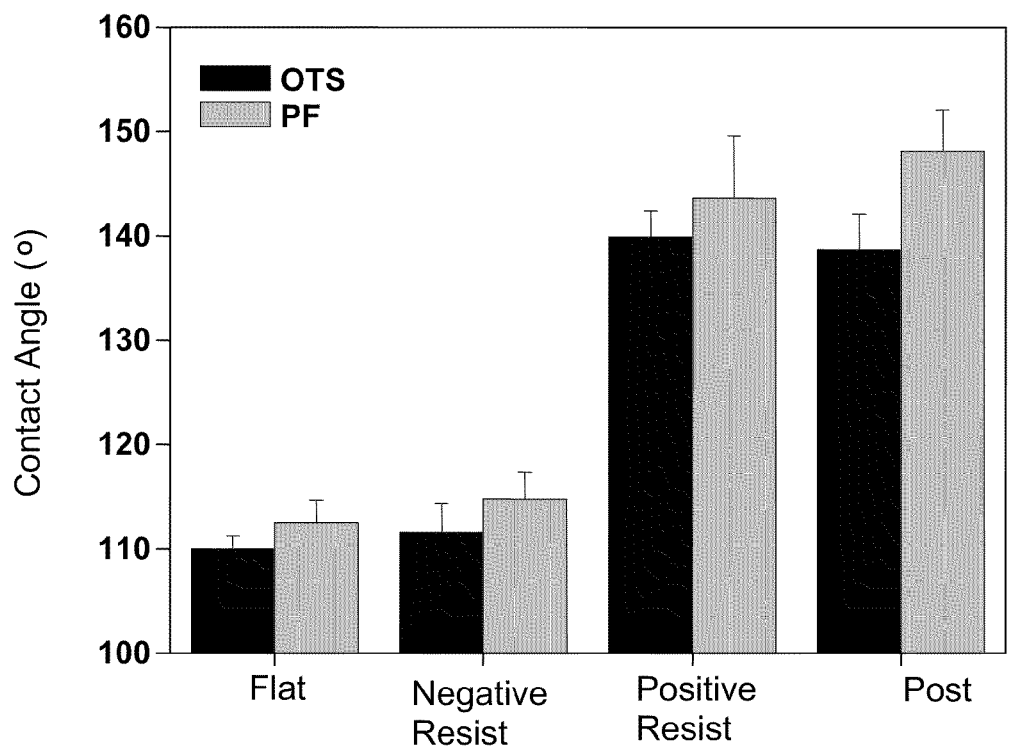
FIG. 7A is graphical representation of the average contact angle for each of the four silicon substrates (flat silicon, nano-tips from negative resists and positive resists, and posts) with both an octadecyltrichlorosilane (OTS) and a PF monolayer surface.

FIG. 7A shows a graph of the contact angle for four different types of substrates: flat silicon, negative substrates, positive substrates, and posts, all covered with either an OTS or a PF monolayer. The PF-coated substrates yield only slightly larger contact angles than OTS. The negative and positive substrates both present similar-sized nano-tips with a similar pitch, but the contact angle and thus the surface energy of these two substrates, is very different. Whereas the negative substrates had contact angles very similar to those of flat silicon, the positive substrates exhibited contact angles similar to those of the posts. The main differences between the two types of surfaces are the degree of roughness and the size of the surface features. The negative substrates are mostly smooth between the nano-tips, and the tip height is relatively short, creating a substrate similar to a flat silicon wafer. In contrast, the positive substrates and the posts are both characterized by heights larger than one nm and a larger effective surface area. However, the surface roughness appears to be quite different between these substrates.

The highly pitted regions, i.e. those regions that optically appear darker, are observed predominately on the positive substrates. The pitted regions had a higher contact angles than their surrounding area. After placing a drop of water directly over a dark region, the drop initially shifts away from these regions. The results reported here are equilibrium measurements after the drops had settled on the surface. The largest variance in the contact angle is among the positive substrates, due to their high sensitivity to fluctuations in the etching process. The predominant contribution to the large contact angle may be the surface roughness and not the exact chemical nature of the hydrophobic surface. For measurements obtained from highly pitted regions, contact angles as large as 162° can be measured.

Figure 7B:
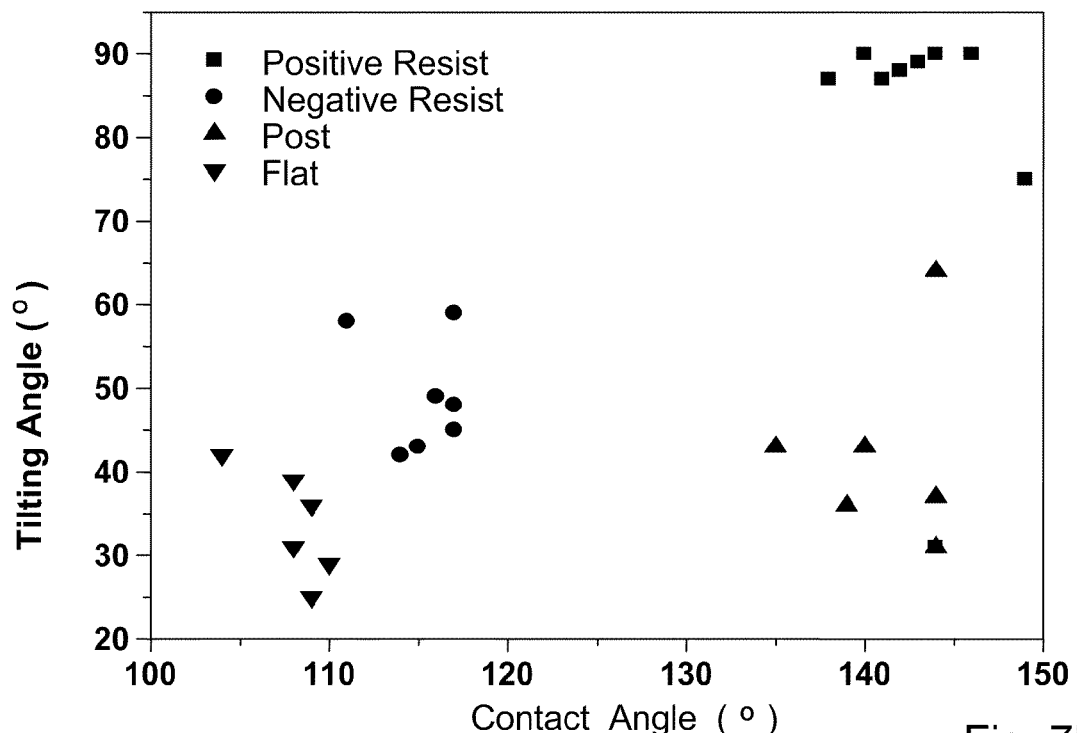
FIG. 7B is a graph representing the contact angle of the four silicon substrates with a PF monolayer versus the tilting angle for each substrate.
Figure 7:
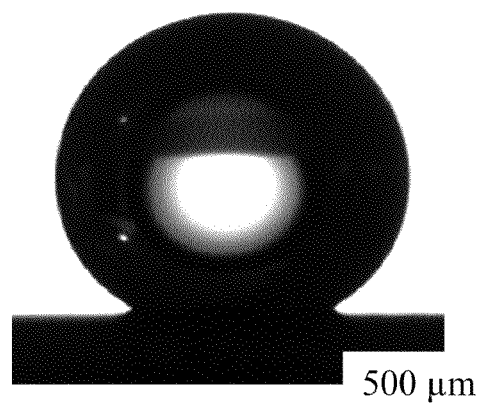
FIGS. 7C-7E are optical images of a 4-µL drop of water on a substrate from a positive resist.
Figure 7:
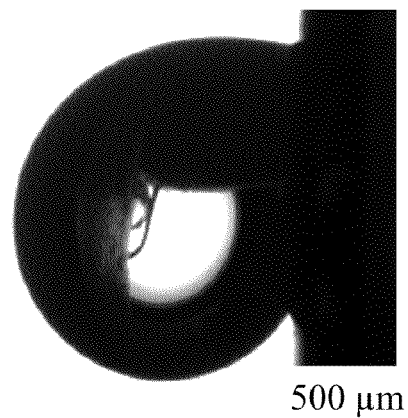
Figure 7:
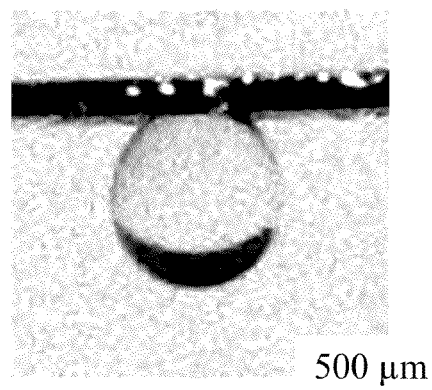

FIG. 7B is a graph representing the contact angle of the four silicon substrates with a PF monolayer versus the tilting angle for each substrate. The substrates from the positive resist that yielded tilting angles near 90° did not roll off the substrate. The angles for the flat substrates and the posts are similar, typically from 25°-45°. The drop rolled from the surface at 31° for one positive substrate as well as for the lowest post. For those substrates whose drop remained stationary at 90°, the sample could be flipped manually to 120° and the drop remained attached to the surface. The minimum required adhesive force, per unit of planar surface area, to keep this drop attached to the substrate at 180° is about 10 pN/mm$^2$.

FIGS. 7C-7D are optical images of a 4-μL, drop of water pinned to a substrate. The contact angle of the drop illustrated in FIG. 7C is 147°. As illustrated in FIG. 7D, when the tilting angle is about 90°, gravity deforms the drop-shape but the drop does not move along the surface. FIG. 7E illustrates a drop suspended upside-down by manually rotating the substrate 180°.

According to another embodiment of the present invention, the above technique of creation of nano-scale surface roughness is used to provide a photo-emitting structures with photoemission that does not depend on the light polarization.

Figure 8A:
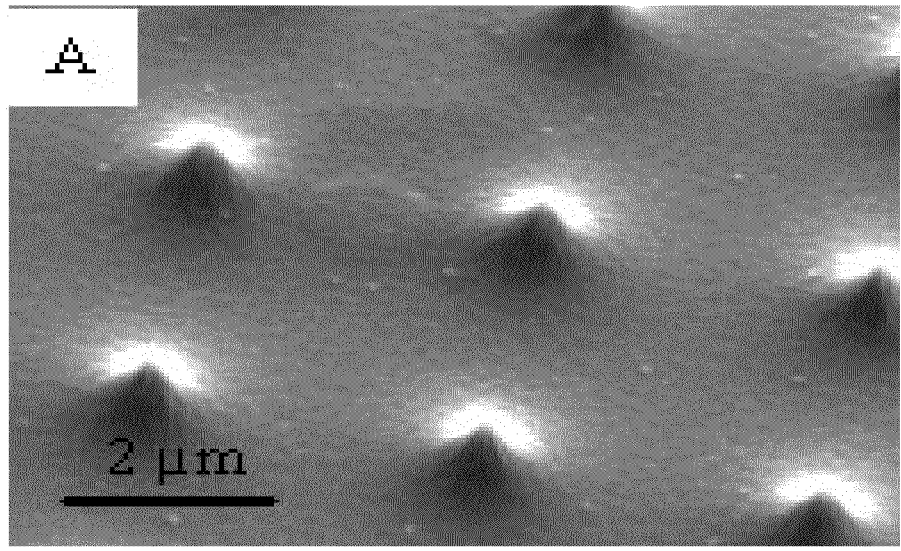
FIGS. 8A-8B are a set of SEM images of two types of surfaces.
Figure 8B:
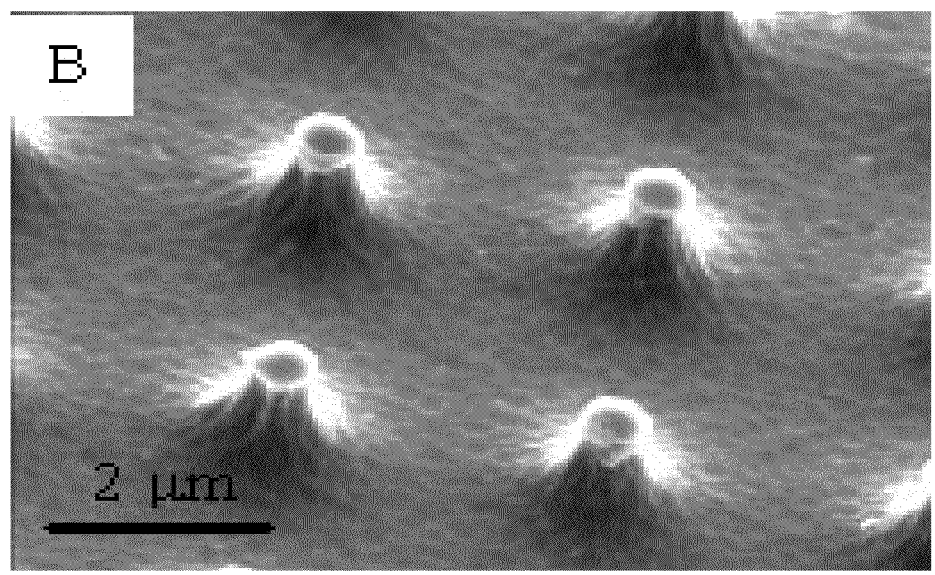

In this connection, reference is made to FIGS. 8A-8B representing a set of SEM images of two types of surfaces having pitted regions. In FIG. 8A the tips height is of few nanometers while in FIG. 8B the tips height is of several tens of nanometers.

Figure 8C:
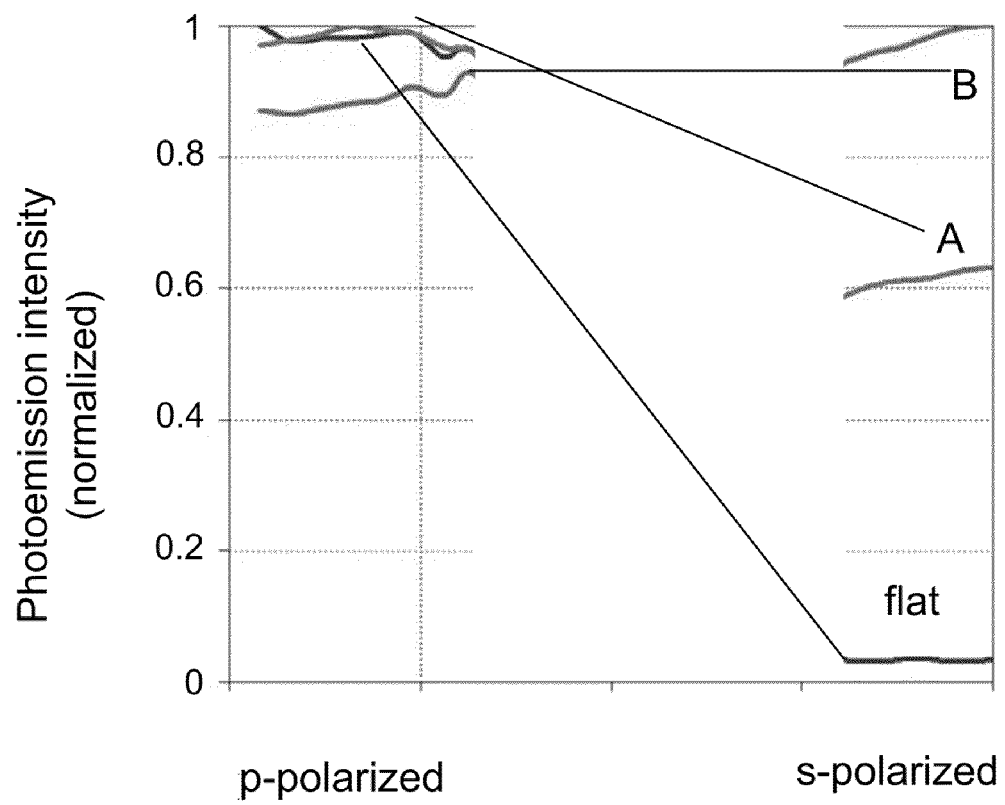
FIG. 8C is a graph representing the photoemission intensity for p-polarization and s-polarization for three different types of surfaces.

FIG. 8C is a graph representing the photoemission intensity for p-polarization and s-polarization measured for three different types of surfaces (A, B of FIGS. 8A-8B and a flat surface). As seen in the figure, the ratio between the intensities of emission due to p-polarized light to that due to s-polarized light (i.e. yields for p- and s-polarized light) is about 20 for a flat surface 1.7 for A type surfaces and 1 for B type surfaces. Therefore, it is shown that for the photoemission from a highly corrugated substrate (i.e. having a nano-scale surface relief) fabricated using the teachings of the present invention does not depend on the light polarization. The substrate can therefore be used in a photocathode structure insensitive to light polarization.

Figure 9A:
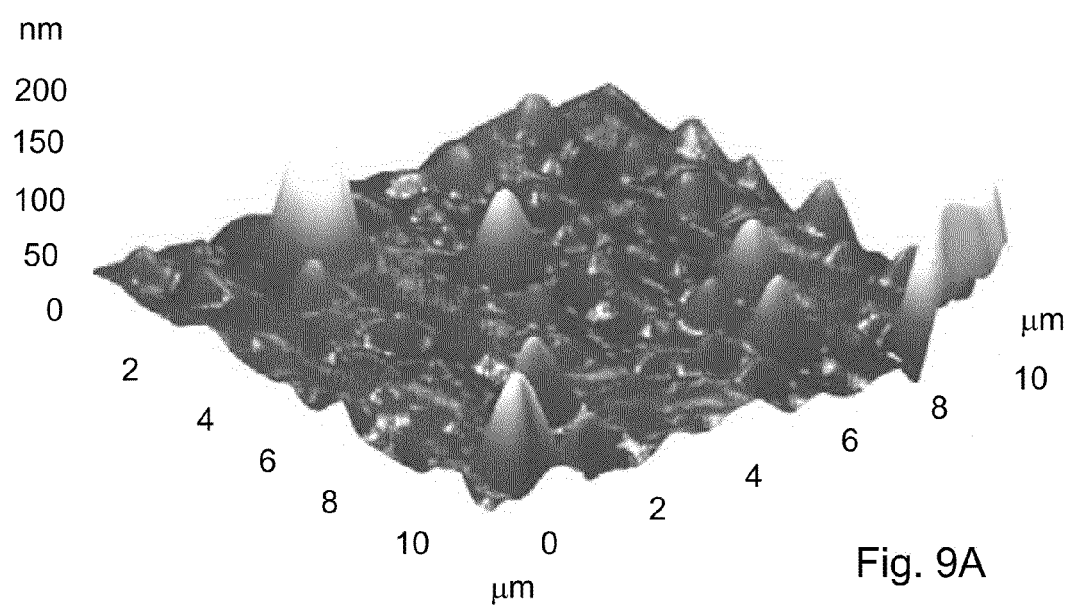
FIG. 9A is a AFM image of a n-type Si (100) mildly corrugated surface fabricated using a wet etching procedure.
Figure 9B:
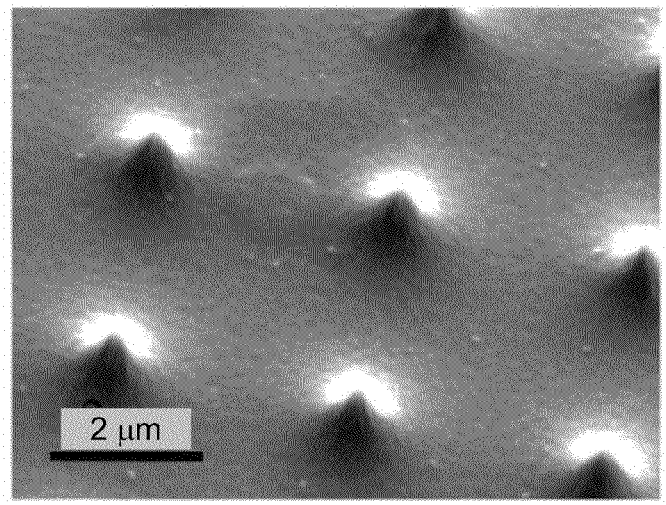
FIG. 9B is a SEM image of a nanotip array Si/SiOx substrates fabricated using the teachings of the present invention.

Reference is made to FIGS. 9A and 9B representing respectively an AFM image (FIG. 9A) of a flat n-type Si (100) mildly corrugated surface fabricated using a wet etching procedure, and a SEM image (FIG. 9B) of a nanotip array Si/SiO$_x$ substrates fabricated using the teachings of the present invention. As detailed above, the technique of the present invention provides a highly corrugated structure/substrate i.e. a substrate having a nano-scale roughness. To compare between the samples, a photoemission signal was recorded as the phase of the exciting pulse was varied for the uncorrugated surface of the n-Si (9A) and for the corrugated surface of the same substrate (9B). The highly corrugated samples have an array of isolated nanotips of diameter of about 15-50 nm and less than 1 μm height. They were fabricated by combining photolithography using a chromium gridlike photomask and a dry etching procedure using inductively coupled plasma reactive ion etching, as described above.

Figure 10A:
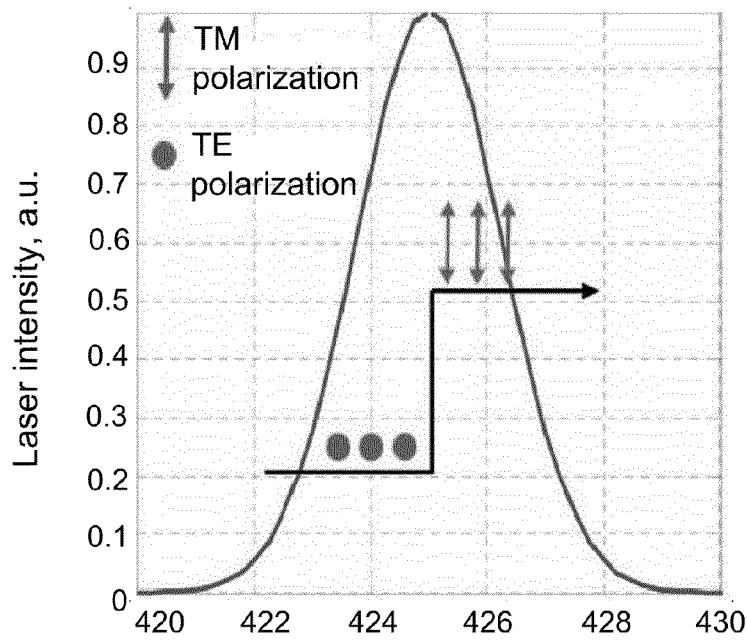
FIG. 10A is a schematic representation of the scanning of a polarization step function over the pulse bandwidth.
Figure 10B:
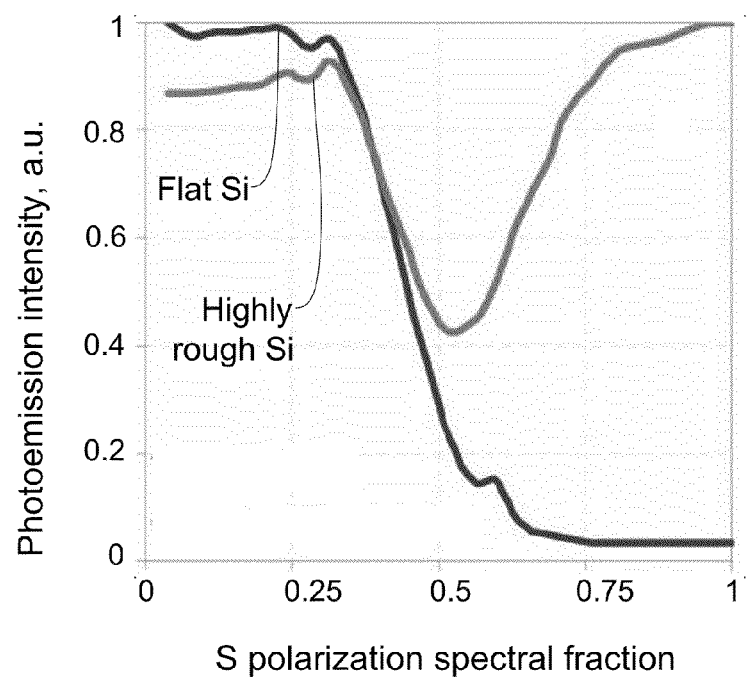
FIG. 10B is the 2PPE intensity profile vs the pulse polarization state, as measured for the highly corrugated samples of FIG. 9B and for a flat surface.

Reference is made to FIGS. 10A-10B illustrating a schematic representation of the scanning of a polarization step function over the pulse bandwidth (10A) and of the 2PPE intensity profile vs the pulse polarization state (10B), as measured for the highly corrugated samples presented in FIG. 9B and for a flat surface. As shown in the FIG. 10B, scanning the step position strongly affects the integrated photoemission signal from a flat Si surface. This is because the p-polarization is more effective in inducing photoemission, which is well established in the case of flat surfaces. When applying the polarization step scan on the highly corrugated silicon surface, the s-polarization, which is non-effective in the case of flat surfaces, produces a signal with a magnitude similar to that obtained with p-polarized light.

In the case of a highly corrugated surface, when the pulse spectral width is divided equally between the two polarizations, the yield of the photoemission depends on the square of the intensity. On an ideal flat surface, for the case of two equal non-interacting s- and p-polarization excitation pathways, namely, without considering the contribution to photoemission from a mixed polarization excitation process, the photoemission intensity is expected to drop to one quarter of its value when equally dividing between the two orthogonal polarizations.

The experimental results, shown in FIG. 10B, indicate a drop to about 40% of the signal instead of the expected 25%. This difference results from the fact that for this corrugation pattern, the TE polarization of the laser is not transformed purely to s-polarization but rather to a mixture of s and p. Similarly, the TM polarization, in the case of a corrugated surface, is divided differently between the s- and p-polarizations than is assumed for the flat substrate.

Figure 11:
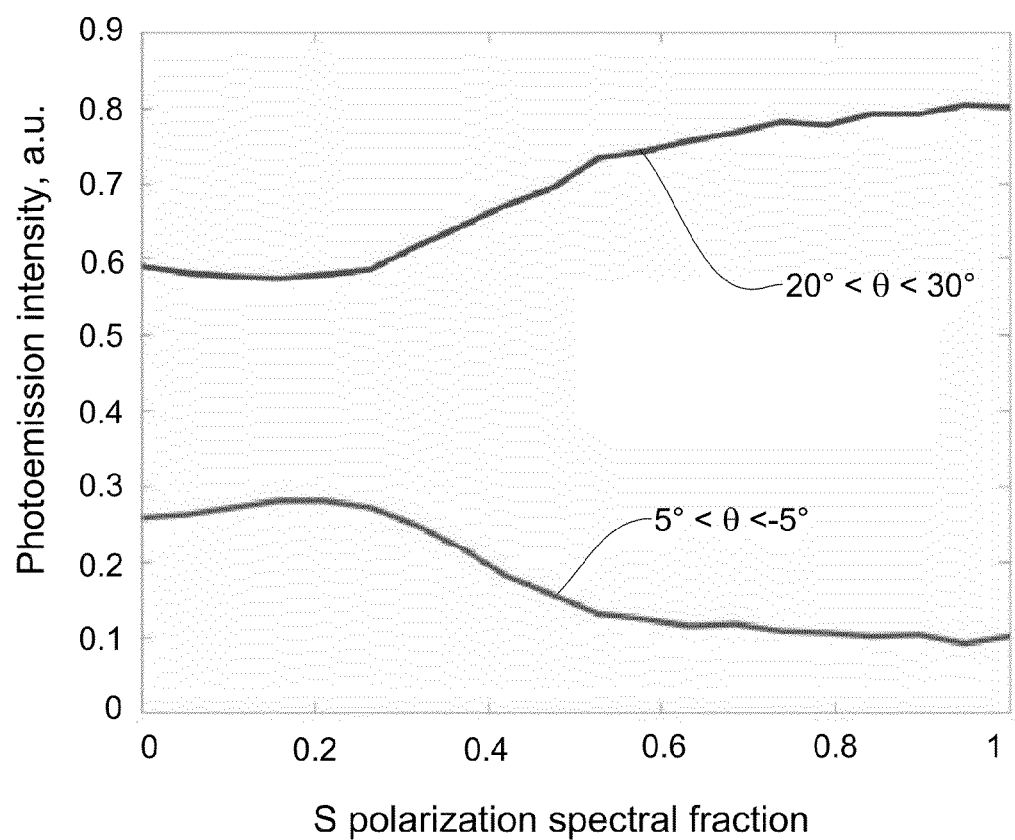
FIG. 11 is a plot of the photoemission signal vs the pulse polarization state, measured for the highly corrugated samples of FIG. 9B.

It is expected that s-polarized light ejects photoelectrons preferentially from the walls of the nanotip structures, which are nearly perpendicular to the substrate. On the other hand, p-polarized light is expected to induce a two-photon process similar to that occurring with smooth surfaces, namely, from the area between the tips. Because of the independent photoemission processes for each polarization, it is expected that variation of the polarization should result in modification of the photoelectrons' angular distribution. Polarization controlled angular distribution is indeed observed, as demonstrated in FIG. 11, showing the dependence of the photoemission intensity on the pulse polarization for two extreme regions of the photoemission angular distribution. As the pulse polarization converges to s-polarization, the photoemission is biased toward large emission angles, in contrast to the wide distribution, centered on the surface normal, observed for excitation with p-polarized light.

Both angle and energy-resolved photoemission intensities can be measured simultaneously using a retarding field that is applied by varying the electric potential on a collector electrode. Thus, it is possible to record the dispersion curves for the photoelectrons while varying the light polarization. Excitation with p-polarization reveals a distribution of the photoelectrons that is symmetric with respect to the surface normal.

This can be explained by the high efficiency of photoelectron emission from the substrate in-between the tips. With s-polarized light, the photoelectrons are ejected much more efficiently from the tips' walls, resulting in photoelectrons emitted at large angles relative to the surface normal.

It should be noted that while referring to p- and s-polarizations as relative to the global properties of the surface, on a local scale, p-polarized light may have s-polarization if the tip is perpendicular to the surface, and vice versa for s-polarization.

Those skilled in the art will readily appreciate that various modifications and changes can be applied to the embodiments of the invention as hereinbefore described without departing from its scope defined in and by the appended claims.

The invention claimed is:

1. A photocathode structure comprising:
    a substrate having a patterned surface,
        the pattern being in the form of nano-scale roughness extending along said surface, and
    a metal or semiconductor containing photoemitting film on said patterned surface of the substrate,
        electron emission from the photocathode in response to incident light being thereby insensitive to polarization of the incident light.

2. The photocathode structure of claim 1, wherein said nano-scale surface roughness of the substrate is in the form of pitted regions comprised of spaced-apart pits.

3. The photocathode structure of claim 1, wherein the nano-scale surface roughness of the substrate is created by application of a controllable etching to said substrate.

4. The photocathode structure of claim 1, wherein said patterned surface has a large surface area of up to several $cm^2$.

5. The photocathode structure of claim 1, which when exposed to the incident light having p-polarization and s-polarization successively, provides a ratio between intensities of emission due to p-polarized light to that due to s-polarized light of about 1.

6. The photocathode structure of claim 2, wherein said pits are randomly inter-dispersed within said surface.

7. The photocathode structure of claim 2, wherein the nano-scale surface roughness of the substrate is created by application of a controllable etching to said substrate, the pits having different etching depths.

* * * * *